United States Patent
Bothra et al.

[11] Patent Number: 6,153,531
[45] Date of Patent: *Nov. 28, 2000

[54] METHOD FOR PREVENTING ELECTROCHEMICAL EROSION OF INTERCONNECT STRUCTURES

[75] Inventors: Subhas Bothra; Jay Patel, both of San Jose, Calif.

[73] Assignee: Philips Electronics North America Corporation, Tarrytown, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,679

[22] Filed: Dec. 22, 1997

[51] Int. Cl.⁷ .................................................. H01L 21/302
[52] U.S. Cl. .......................... 438/745; 438/750; 438/753; 438/754; 438/757
[58] Field of Search ..................... 438/745, 751, 438/755, 756, 757, 692, 693; 156/643

[56] References Cited

U.S. PATENT DOCUMENTS

| | | | |
|---|---|---|---|
| 4,576,884 | 3/1986 | Reisman | 430/30 |
| 4,665,610 | 5/1987 | Barth | 29/580 |
| 4,668,335 | 5/1987 | Mockler et al. | 156/643 |
| 4,879,257 | 11/1989 | Patrick | 437/195 |
| 4,906,586 | 3/1990 | Blackburn | 437/40 |
| 5,024,747 | 6/1991 | Turner et al. | 204/298.09 |
| 5,030,590 | 7/1991 | Amini et al. | 437/233 |
| 5,134,085 | 7/1992 | Gilgen et al. | 437/52 |
| 5,244,534 | 9/1993 | Yu et al. | 156/636 |
| 5,281,320 | 1/1994 | Turner et al. | 204/298.15 |
| 5,793,105 | 8/1998 | Pace | 257/700 |
| 5,808,210 | 9/1998 | Herb et al. | 73/862.59 |
| 5,893,756 | 4/1999 | Berman et al. | 438/692 |
| 5,928,968 | 7/1999 | Bothra et al. | 438/745 |

OTHER PUBLICATIONS

S.T. Cho, K. Najafi, C.L. Lowman and K.D. Wise, "*An Ultrasensitive Silicon Pressure–Based Flowmeter*", 1989 IEEE, Center for Integrated Sensors and Circuits, Dept. of Electrical Engineering and Computer Science, University of Michigan, Ann Arbor, MI.

S. Wolf, Ph.D. and R. Tauber, Ph.D., "*Silicon Processing for the VLSI Era*", vol. 1: Processing Technology, Lattice Press, Sunset Beach, CA.

*Primary Examiner*—Benjamin L. Utech
*Assistant Examiner*—Lan Vinh
*Attorney, Agent, or Firm*—Martine Penilla & Kim, LLP

[57] ABSTRACT

Disclosed is a method for fabricating reliable interconnect structures on a semiconductor substrate that has at least a first dielectric layer, a first patterned metallization layer, a second dielectric layer over the first patterned metallization layer, and a plurality of tungsten plugs formed in the second dielectric layer. The method includes patterning a second metallization layer that overlies the second dielectric layer and the plurality of tungsten plugs, such that the patterning leaves at least one of the plurality of tungsten plugs not completely covered by the second metallization layer. Submersing the semiconductor substrate into a dilute nitric acid solution until a passivating tungsten oxide is formed over a portion of the at least one of the plurality of tungsten plugs that is not completely covered by the second metallization layer. The method further includes submersing the semiconductor substrate into a basic cleaning solution, and the passivating tungsten oxide is configured to prevent the at least one of the plurality of tungsten plugs from eroding in the basic cleaning solution. Preferably, the dilute nitric acid solution is adjusted to have a pH level of between about 1.5 and about 3 so that the passivating tungsten oxide becomes insoluble.

15 Claims, 7 Drawing Sheets

METHOD FOR PREVENTING ELECTROCHEMICAL EROSION OF INTERCONNECT STRUCTURES

CROSS REFERENCE TO RELATED APPLICATIONS

This application is related to the following U.S. patent applications: (1) Ser. No. 08/995,650, filed on the same day as the instant application, and entitled "Programmable Semiconductor Structures and Methods for Making the Same"; (2) Ser. No. 08/995,500, filed on the same day as the instant application, and entitled "Semiconductor Pressure Transducer Structures and Methods for Making the Same"; (3) Ser. No. 08/995,652, filed on the same day as the instant application, and entitled "Method and Apparatus For Rapidly Discharging Plasma Etched Interconnect Structures"; and (4) Ser. No. 08/995,651, filed on the same day as the instant application, and entitled "Method and Apparatus For Making Reliable Interconnect Structures." These applications are hereby incorporated by reference.

BACKGROUND OF THE INVENTION

1. Field of the Invention

The present invention relates generally to semiconductor circuits and, more particularly, to a method for fabricating reliable interconnect structures in semiconductor integrated circuits.

2. Description of the Related Art

Interconnect structures of integrated circuits (ICs) generally take the form of patterned metallization lines that are used to electrically interconnect devices and to provide interconnection with external circuitry. By way of example, IC devices may include complementary metal oxide semiconductor ("CMOS") devices having diffused source and drain regions that are separated by channel regions, and gates that are located over the channel regions. In practice, an IC chip may include thousands or millions of devices, such as CMOS transistors.

Conventionally, a dielectric layer (e.g., silicon dioxide) is deposited over the devices that are formed on a substrate, and via holes are formed through the dielectric layer to the devices below. As is well known in the art, photolithography "patterning" is typically accomplished by depositing a photoresist layer over the dielectric layer, selectively exposing the photoresist to light through a patterned reticle having via hole patterns, developing the photoresist to form a photoresist via mask, and etching the exposed dielectric layer to form the via holes that lead to a lower level. Once the via holes are formed, a conductive material such as tungsten (W) is used to fill the via holes to define what are known as "tungsten plugs." Once the tungsten plugs are formed, a metallization layer is formed over the dielectric layer and the tungsten plugs. The metallization layer is then patterned using conventional photolithography and plasma etching techniques to define a first level of interconnect metal routing. This process may then be repeated if additional layers of interconnect structures are desired.

To facilitate discussion, FIG. 1 shows a cross-sectional view of a semiconductor substrate 100 having a number of layers fabricated thereon. In this example, the semiconductor substrate 100 has a first dielectric layer 102 deposed over its surface, and a first metallization layer 104 patterned over the first dielectric layer 102. A second dielectric layer 106 is then deposited over the first dielectric layer 102 and the first metallization layer 104. Before a second metallization layer 110 is patterned over the second dielectric layer, via holes are etched and filled with a tungsten material to form tungsten plugs 108. At this point, the second metallization layer 110 is plasma etched to define the desired interconnect lines.

As is well known, conventional plasma etching will cause the semiconductor substrate 100 to be negatively charged, and all metallization features 104/110 and tungsten plugs 108 (i.e., unless they are coupled to the substrate 100) to be positively charged. Once the plasma etching is complete, the substrate 100 is conventionally moved to a basic solution cleaning station where it is submerged in an effort to remove any polymer residues produced during the plasma etching.

Although the basic solution submersing works well in removing the polymer residues, if any one of the tungsten plugs 108 are exposed to the basic solution, the tungsten material will erode away (also known in the art as "corrosion"). As shown in FIG. 1, tungsten plugs 108a are completely covered by the second metallization layer 110, however, a path 120 remains exposing tungsten plug 108b. As mentioned above, because the first metallization layer 104 and the second metallization layer 110 are not coupled to the substrate 100 (i.e., the structure is a floating structure), they will be positively charged and therefore the tungsten plug 108b will erode. If any tungsten plugs 108b erode, the entire IC chip may fail to operate for its intended purpose, thereby driving up fabrication costs.

Because CMOS semiconductor circuits are continuing to decrease in size, and more devices are packed into smaller IC chips, more densely integrated interconnect structures will be required. However, this dense integration has the effect of pushing the limits of conventional photolithography patterning, which necessarily makes photolithography mask misalignments more likely to occur. Of course, when more misalignments occur, more paths 120 will result, thereby increasing the number of exposed tungsten plugs 108b.

In view of the foregoing, there is a need for improved CMOS fabrication techniques that prevent any exposed tungsten plugs from eroding during the basic solvent cleaning operation.

SUMMARY OF THE INVENTION

Broadly speaking, the present invention fills these needs by providing a method that prevents exposed tungsten plugs from eroding during standard CMOS fabrication. It should be appreciated that the present invention can be implemented in numerous ways, including as a process, an apparatus, a system, a device, or a method. Several inventive embodiments of the present invention are described below.

In one embodiment, a method for making reliable interconnect structures on a semiconductor substrate having a first dielectric layer is disclosed. The method includes plasma patterning a first metallization layer over the first dielectric layer. Forming a second dielectric layer over the first metallization layer and the first dielectric layer. Forming a plurality of tungsten plugs in the second dielectric layer, such that each of the plurality of tungsten plugs are in electrical contact with the first metallization layer. Plasma patterning a second metallization layer over the second dielectric layer and the plurality of tungsten plugs, such that at least a gap over at least one of the tungsten plugs is not covered by the second metallization layer. Submersing the semiconductor substrate into a dilute acid solution until a passivating oxide film is formed over the at least one of the tungsten plugs that is not covered by the second metallization layer. The method further includes submersing the semiconductor substrate into a basic solution to remove plasma patterning polymer residues.

In another embodiment, a system for fabricating an interconnect structure on a semiconductor substrate that has a first dielectric layer, a first patterned metallization layer, a second dielectric layer over the first patterned metallization layer, and a plurality of tungsten plugs formed in the second dielectric layer is disclosed. The system includes plasma means for patterning a second metallization layer that overlies the second dielectric layer and the plurality of tungsten plugs. The plasma means is configured to leave at least one of the plurality of tungsten plugs not completely covered by the second metallization layer. Means for submersing the semiconductor substrate into a dilute nitric acid solution until a passivating tungsten oxide is formed over a portion of the at least one of the plurality of tungsten plugs that is not completely covered by the second metallization layer. The system further includes means for submersing the semiconductor substrate into a basic cleaning solution, wherein the passivating tungsten oxide prevents the at least one of the plurality of tungsten plugs from eroding in the basic cleaning solution.

In yet another embodiment, a method for fabricating an interconnect structure on a semiconductor substrate that has a first dielectric layer, a first patterned metallization layer, a second dielectric layer over the first patterned metallization layer, and a plurality of tungsten plugs formed in the second dielectric layer is disclosed. The method includes patterning a second metallization layer that overlies the second dielectric layer and the plurality of tungsten plugs, such that the patterning leaves at least one of the plurality of tungsten plugs not completely covered by the second metallization layer. Submersing the semiconductor substrate into a dilute nitric acid solution until a passivating tungsten oxide is formed over a portion of the at least one of the plurality of tungsten plugs that is not completely covered by the second metallization layer. The method further includes submersing the semiconductor substrate into a basic cleaning solution, and the passivating tungsten oxide is configured to prevent the at least one of the plurality of tungsten plugs from eroding in the basic cleaning solution.

One advantage of the present invention is that very reliable interconnect structures can be fabricated without the danger of losing tungsten plugs to erosion (i.e., also known as "corrosion") in a basic solution used to remove post plasma etching polymer residues. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention that prevents exposed tungsten plugs from eroding during standard CMOS fabrication is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
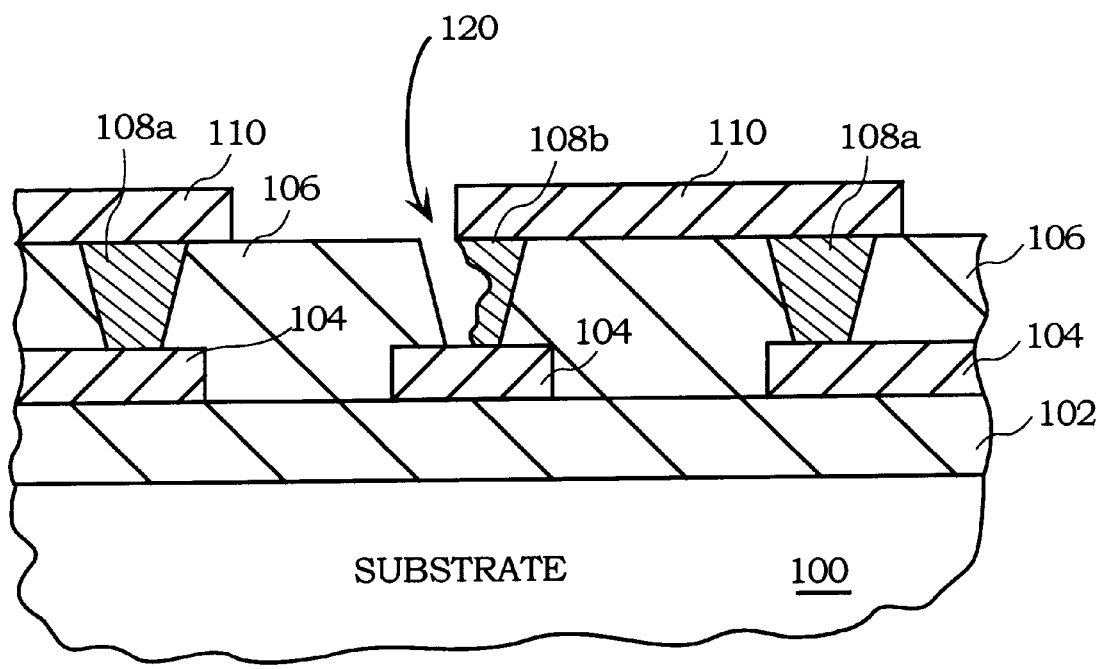
FIG. 1 shows a cross-sectional view of a semiconductor substrate having an eroded tungsten plug.
Figure 2:
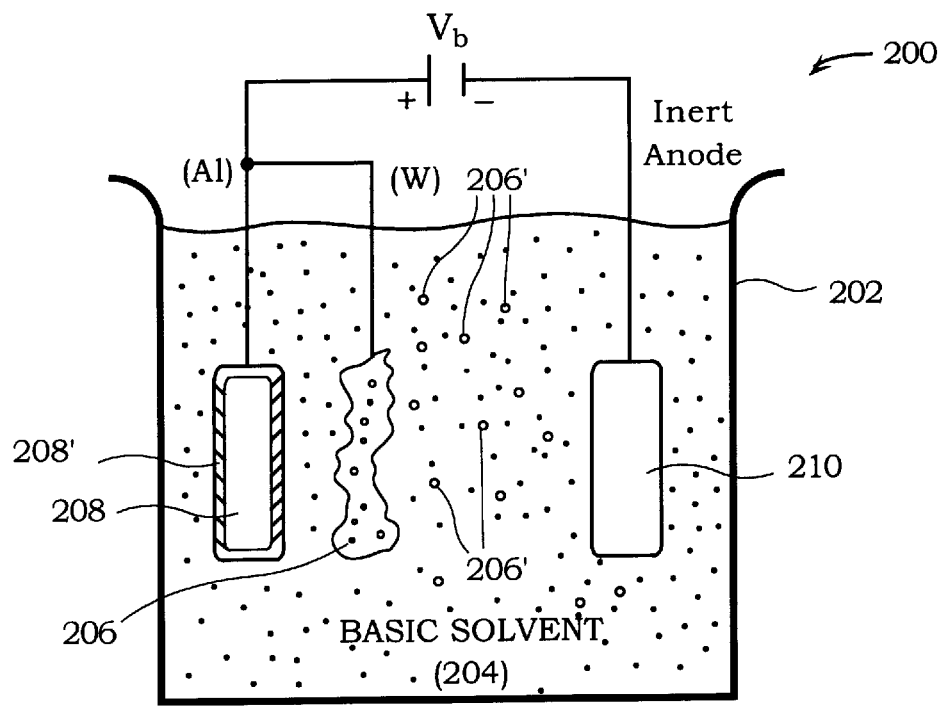
FIG. 2 shows a chemical reaction system having an aluminum electrode and a tungsten electrode submerged in a basic solution in accordance with one embodiment of the present invention.

FIG. 2 shows a chemical reaction system 200 having an aluminum electrode 208 and a tungsten electrode 206 submerged in a basic solution 204 in accordance with one embodiment of the present invention. In this example, both the aluminum electrode 208 and the tungsten electrode 206 are coupled to a positive bias voltage $V_b$, and a negative electrode 210 is coupled to a negative terminal of the bias voltage $V_b$. The basic solvent 204 is preferably an electrolyte that preferably has a pH level that is greater than about 7, and more preferably is greater than about 8, and most preferably is greater than about 10.

Although a chemical reaction between the aluminum electrode 208 and the basic solvent 204, and the tungsten electrode 206 and the basic solvent 204 will naturally occur without the application of a bias voltage $V_b$, the chemical reaction in the basic solvent 204 may be accelerated by applying the bias voltage $V_b$. For example, when the bias voltage $V_b$ is applied between the two electrodes, the tungsten electrode 206 will rapidly begin to erode by reacting with the basic solvent 204. This reaction produces tungsten oxide $WO_2$ 206' which rapidly dissolves in lightly basic solutions. Once the reaction begins, the tungsten will continue to oxidize until the tungsten electrode 206 is completely eroded. In contrast however, the aluminum electrode 208 will not erode in the basic solvent 204, but will form an aluminum oxide passivation layer 208'.

Figure 3A:
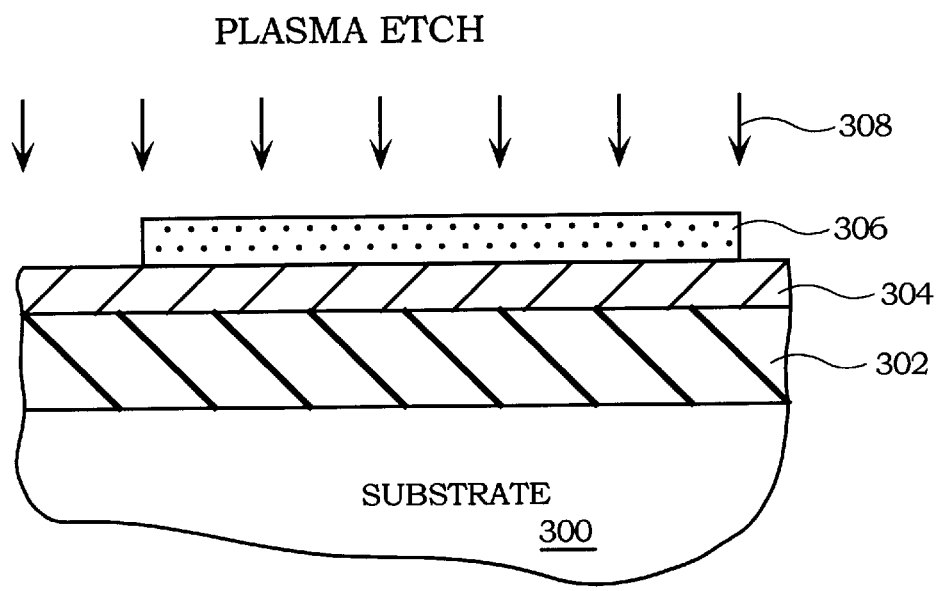
FIG. 3A shows a cross-sectional view of a partially fabricated semiconductor structure that is formed over a substrate in accordance with one embodiment of the present invention.

FIG. 3A shows a cross-sectional view of a partially fabricated semiconductor structure that is formed over a substrate 300 in accordance with one embodiment of the present invention. In an initial operation, an inter-metal oxide 302 is formed over the substrate 300, and then a metallization layer 304 is sputtered over the inter-metal oxide layer 302. In order to pattern the metallization layer 304, a photoresist mask 306 is formed over the metallization layer 304. As is well known, the photoresist mask 306 may be patterned using any number of well known techniques, including conventional photolithography.

Once the photoresist mask 306 has been formed, a plasma etching operation 308 is performed to remove the metallization layer 304 that is not covered by the photoresist mask 306. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 300 to a negative potential (−), and the metallization layers that are not electrically connected to the substrate 300 (i.e., through conductive via structures), to a positive potential (+).

Figure 3B:
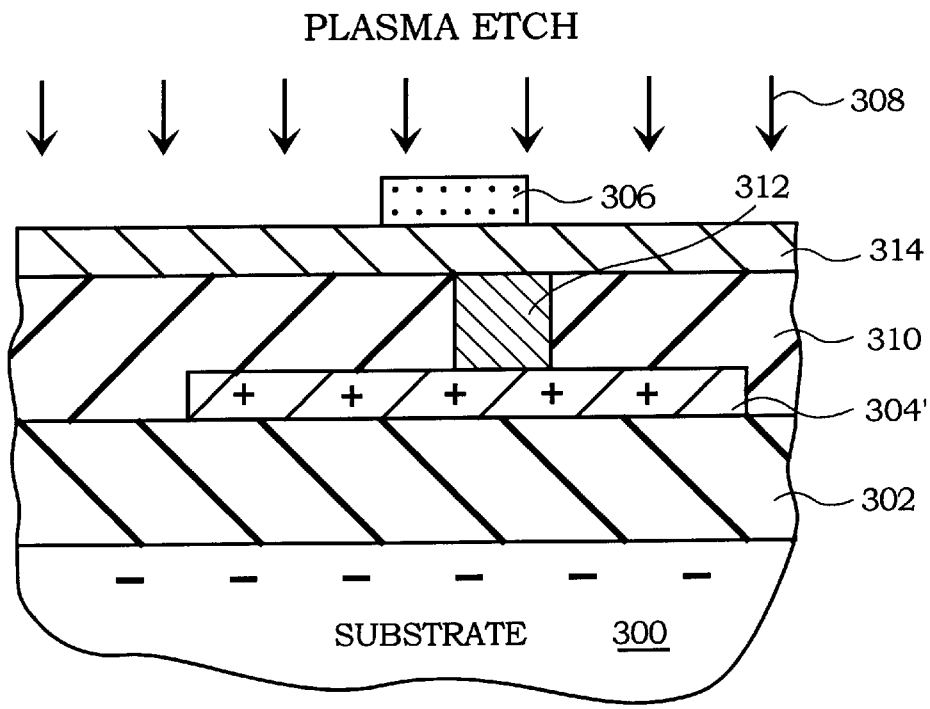
FIG. 3B shows a cross-sectional view of the semiconductor structure of FIG. 3A after a number of layers are fabricated over an inter-metal oxide layer and a patterned metallization layer in accordance with one embodiment of the present invention.

FIG. 3B shows a cross-sectional view of the semiconductor structure of FIG. 3A after a number of layers are fabricated over the inter-metal oxide layer 302 and a patterned metallization layer 304' in accordance with one embodiment of the present invention. As pictorially shown, the patterned metallization layer 304' was charged to a positive (+) potential, and is a floating structure that is not connected to a diffusion or gate of the substrate 300. In this example, an inter-metal oxide layer 310 was formed over the patterned metallization layer 304', and a tungsten plug 312 was formed within a via that was etched into the inter-metal oxide layer 310.

Figure 3C:
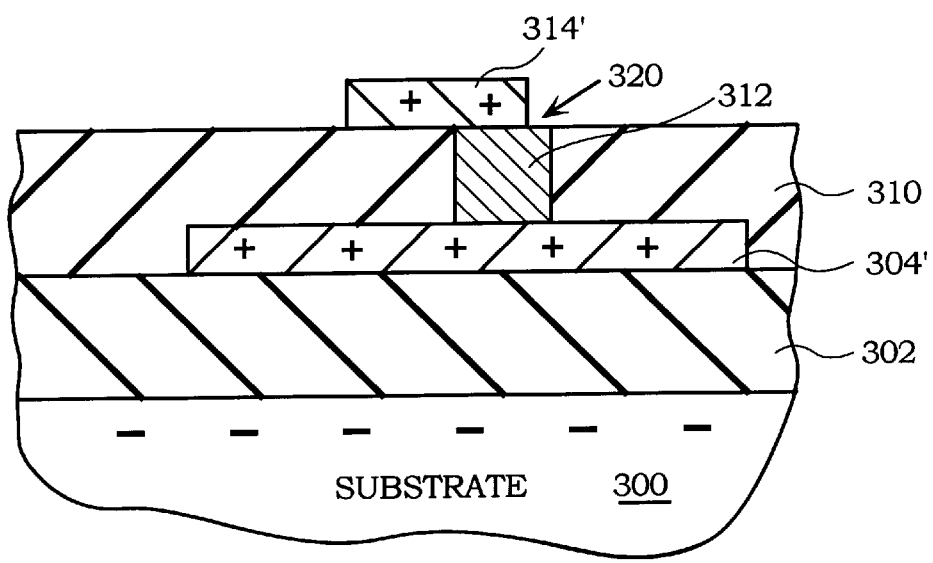
FIG. 3C shows the cross-sectional view of FIG. 3B after a top metallization layer is etched in a plasma etcher in accordance with one embodiment of the present invention.

After the tungsten plug 312 is formed into the inter-metal oxide layer 310, a metallization layer 314 is sputtered over the inter-metal oxide layer 310 and the tungsten plug 312. In order to pattern the metallization layer 314, a photoresist mask 306 is patterned over the metallization layer 314. In this example, the photoresist mask 306 may be patterned with an undesirable misalignment such that at least a portion of the tungsten plug 312 is exposed once the metallization layer 314 is etched. Therefore, once the plasma etch operation 308 is performed, the structure of FIG. 3C will result. As shown, a patterned metallization layer 314' will now lie over the inter-metal oxide layer 310, and over substantially all of the tungsten plug 312, except for a gap 320.

Because the plasma etching operations induce a positive charge "Q" (i.e., Q=C*V), that is equivalent to the capacitance "C" of the patterned metallization layers 304' and 314' multiplied by the induced plasma voltage, any misalignment produced gaps 320 will be vulnerable to erosion during submersion in a basic cleaning solution.

Figure 4:
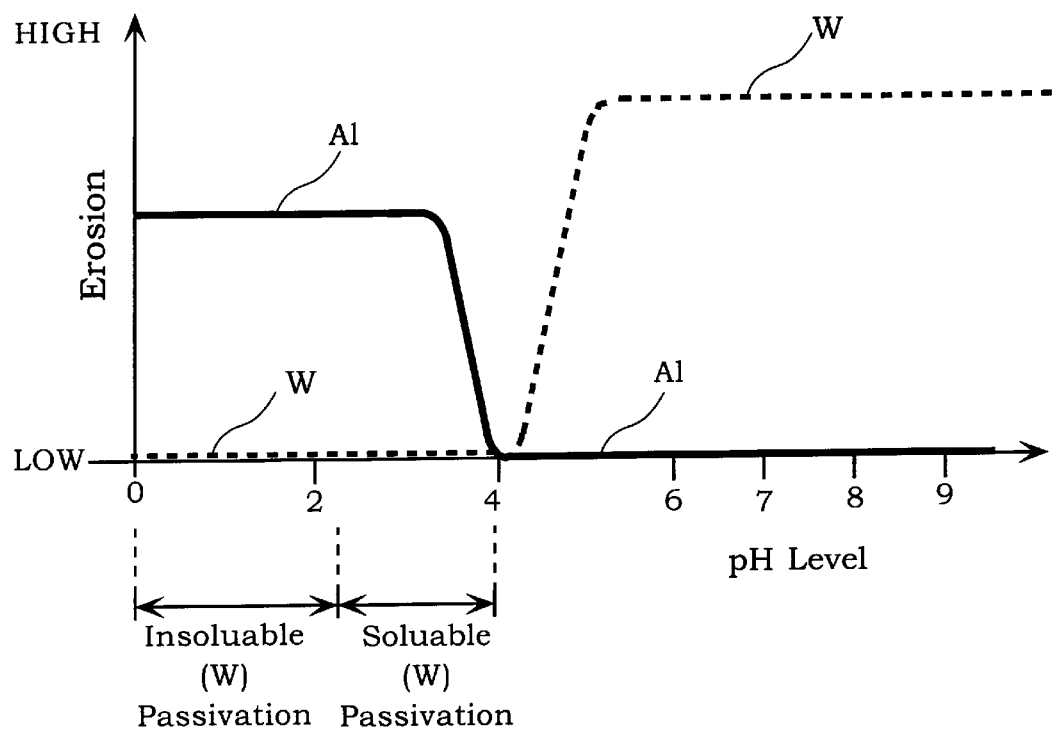
FIG. 4 is a graph that plots the erosion response of aluminum and tungsten when submersed in a range of different pH levels in accordance with one embodiment of the present invention.

FIG. 4 is a graph that plots the erosion response of aluminum and tungsten when submerged in a range of different pH levels in accordance with one embodiment of the present invention. As mentioned above, tungsten will have a high erosion rate in basic solutions (i.e., pH>7), while the aluminum builds up a passivation layer. In more acidic solutions approaching a pH of about 4, the erosion rate of tungsten will decrease to about zero, and as the pH decreases below about 4, a passivation layer will form on the tungsten material. At the same time, the aluminum will begin to erode at pH levels below about 4, however, the maximum erosion rate will be less than that of tungsten.

A difference in the types of tungsten passivation also occurs at a pH of about 2. That is, for pH levels less than about 2, an insoluble passivation will build-up on the tungsten material and for pH levels between about 2 and 4, a soluble passivation will build-up on the tungsten material. Although the aluminum erosion rate will increase below pH levels of about 4, the amount of aluminum material that is used to form the metallization lines 314' is substantially greater than the amount tungsten used to form the tungsten plugs 312. Therefore, the minimal amount of aluminum loss will generally not negatively impact the performance of an interconnect structure.

Accordingly, in one embodiment of the present invention, the semiconductor substrate 300 is preferably submerged into an acidic solution after the metallization layer 314 is plasma etched to form the patterned metallization layer 314' and before it is submersed into a basic solution for polymer residue cleaning.

Figure 5A:
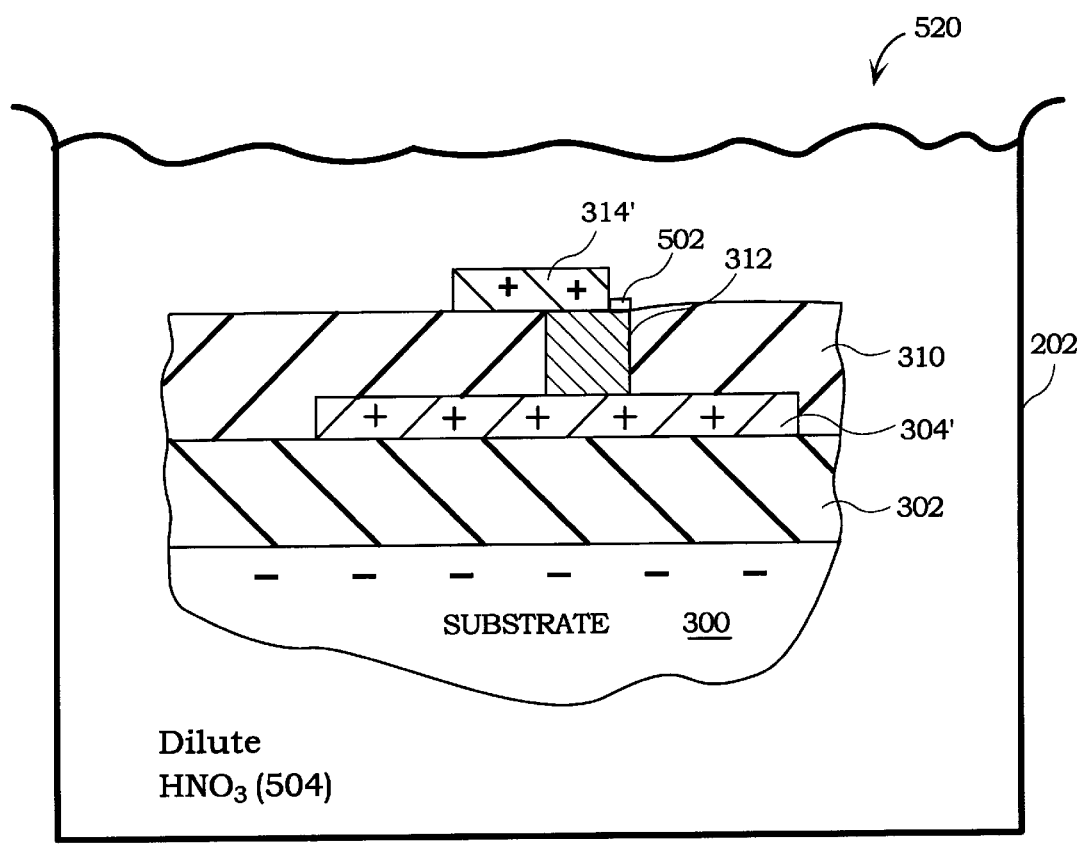
FIG. 5A shows a controlled passivation treatment system in accordance with one embodiment of the present invention.

FIG. 5A shows a controlled passivation treatment system 520 in accordance with one embodiment of the present invention. In this embodiment, a tank 202 having a dilute nitric acid ($HNO_3$) 504 is used for submerging the substrate 300 after plasma etching the metallization layer 314. Preferably, the dilute nitric acid 504 is about 200 parts $H_2O$ and about 1 part $HNO_3$, and most preferably is about 100 parts $H_2O$ and about 1 part $HNO_3$. The pH level of the nitric acid 504 is preferably calibrated to be between about 1.5 and about 3, and more preferably between about 1.7 and about 2.7, and most preferably about 2.0.

By maintaining these preferred pH levels in the tank 202, it is possible to induce a tungsten passivation layer (i.e., a tungsten oxide film $WO_3$) 502 over any exposed regions of the tungsten plugs 312. Although some of the patterned metallization layer 314' may be eroded at this pH level, the amount of erosion is not substantial since a large amount of patterned aluminum will typically lie throughout a given metallization layer. In this embodiment, the semiconductor substrate 300 is preferably submerged in the dilute nitric acid 504 for a period of time ranging between about 2 and about 20 minutes, and more preferably between about 4 and 15 minutes, and most preferably for about 10 minutes. Once the tungsten passivation layer 502 has formed over any and all exposed tungsten plugs 312, the substrate 300 is removed from the dilute nitric acid 504. After being removed from the dilute nitric acid 504, the wafer is rinsed with pure water to remove as much as the nitric acid as possible.

Figure 5B:
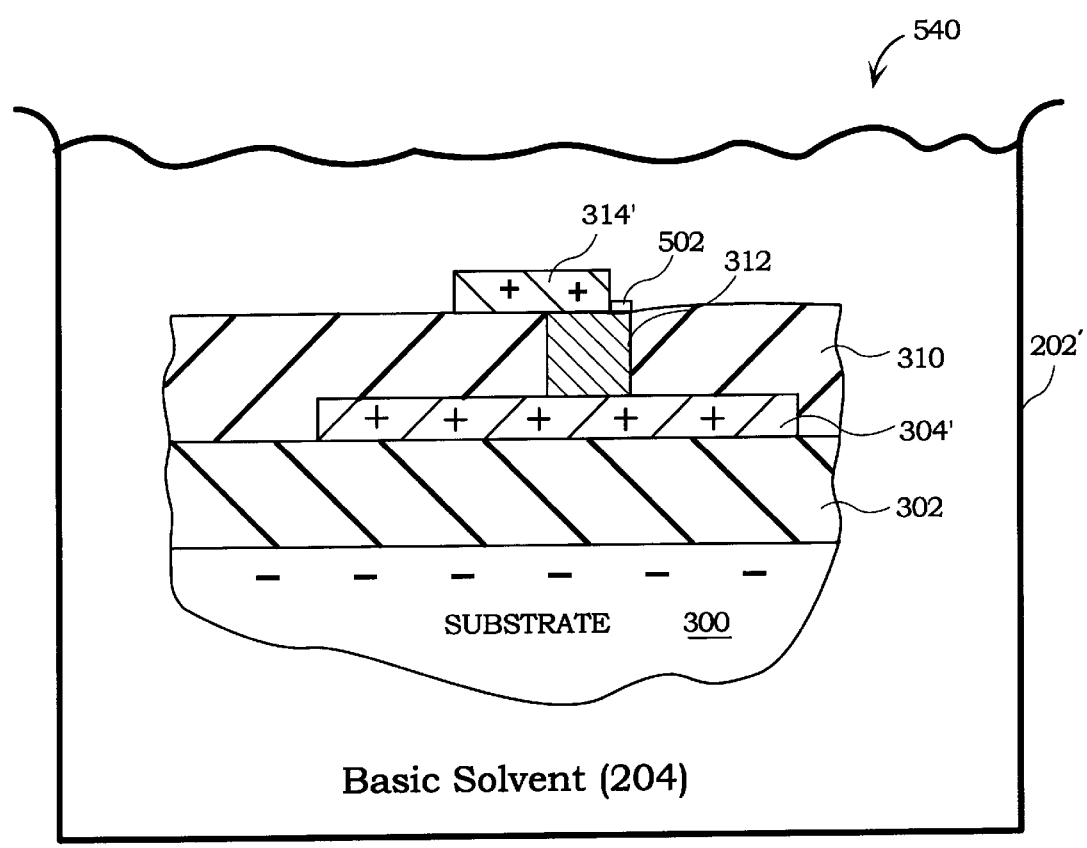
FIG. 5B show a post plasma etching cleaning system in accordance with one embodiment of the present invention.

FIG. 5B show a post plasma etching cleaning system 540 in accordance with one embodiment of the present invention. As shown, the substrate 300 is submerged into an electrolyte basic solution 204 of a tank 202' after the tungsten passivation layer 502 is formed in the dilute nitric acid 504. As mentioned above, the electrolyte basic solution, that has a pH greater than about 7 is used to remove polymer residues that are introduced during plasma etching. Advantageously, because all of the exposed tungsten plugs have the protective tungsten passivation layer 502, the tungsten plugs 312 will not erode in the basic solution. Further, because the tungsten plugs 312 remain intact, the interconnect structures will be more reliable.

Figure 6:
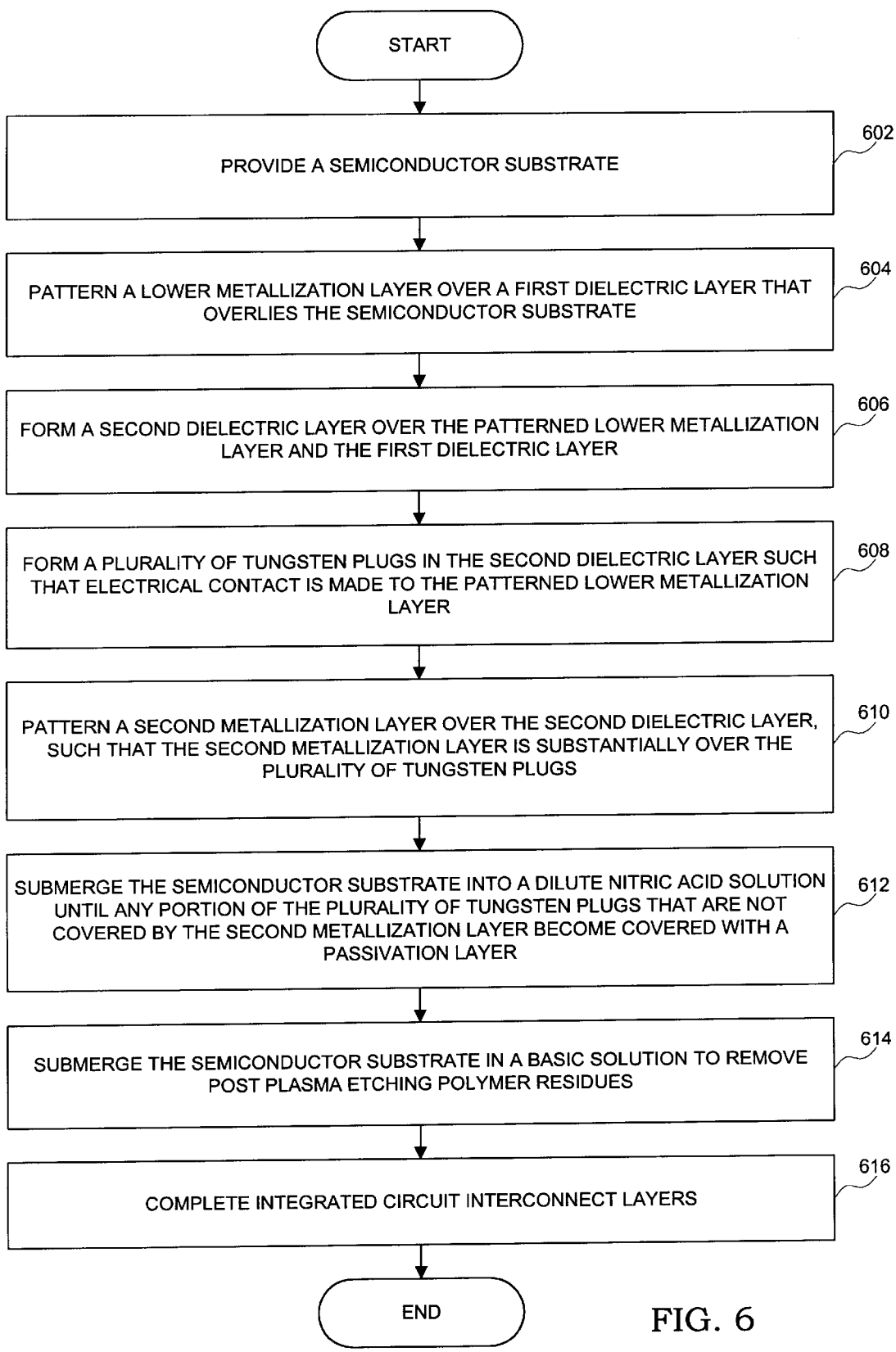
FIG. 6 is a flowchart diagram illustrating the preferred method operations used in fabricating reliable interconnect structures in accordance with one embodiment of the present invention.

FIG. 6 is a flowchart diagram illustrating the preferred method operations used in fabricating reliable interconnect structures in accordance with one embodiment of the present invention. The method begins at an operation 602 where a semiconductor substrate is provided. In general, the semiconductor substrate may be any substrate that may benefit from reliable tungsten plugs that are used in interconnect structures. The method then proceeds to an operation 604 where a lower metallization layer is patterned over a first dielectric layer that overlies the semiconductor substrate. Once the lower metallization layer has been patterned, the method will proceed to an operation 606 where a second dielectric layer is formed over the patterned lower metallization layer and the first dielectric layer. After the second dielectric layer has been formed, the method will proceed to an operation 608.

In operation 608, a plurality of tungsten plugs are formed into the second dielectric layer such that electrical contact is made with the patterned lower metallization layer. Next, a second metallization layer is patterned over the second dielectric layer, such that the second metallization layer is substantially over the plurality of tungsten plugs. Of course, it is a general intention that the tungsten plugs be completely covered by an overlying metallization line, however, photolithography misalignments tend to prevent perfect overlaps.

The method will then proceed to an operation 612 where the semiconductor substrate is submerged into a dilute nitric acid solution having a pH level of between about 1.5 and about 3. The submerging operation should be long enough to form a tungsten passivation layer over any tungsten plugs that are not fully covered by an overlying metallization feature (i.e., any exposed tungsten plugs). In this manner, the tungsten passivation layer will prevent the exposed tungsten plugs from eroding during a subsequent operation. Once removed from the dilute nitric acid, the semiconductor wafer is rinsed with water to remove as much of the nitric acid as possible.

The method will now proceed to an operation 614 where the semiconductor substrate is submerged in a basic solution to remove post plasma etching polymer residues. It should be noted that although the floating metallization features are positively charged during the basic solution submersion operation, none of the exposed tungsten plugs will erode, thereby producing highly reliable interconnect structures. The method will then proceed to an operation 616 where the remaining integrated circuit interconnect layers are completed, and the method will end. It should be understood that although reliable interconnect structures were described with regard to the first two metallization layers, the above described embodiments are equally applicable to other metallization layers.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making reliable interconnect structures on a semiconductor substrate having a first dielectric layer, comprising:

plasma patterning a first metallization layer over the first dielectric layer;

forming a second dielectric layer over the first metallization layer and the first dielectric layer;

forming a plurality of tungsten plugs in the second dielectric layer, such that each of the plurality of tungsten plugs are in electrical contact with the first metallization layer;

plasma patterning a second metallization layer over the second dielectric layer and the plurality of tungsten plugs, such that at least a gap over at least one of the tungsten plugs is not covered by the second metallization layer;

submersing the semiconductor substrate into a dilute acid solution until a tungsten oxide passivating film is formed over the at least one of the tungsten plugs that are not covered by the second metallization layer, wherein the tungsten oxide passivating film is insoluble to basic solutions; and submersing the semiconductor substrate into a basic cleaning solution after the submersing into the dilute acid solution to remove plasma patterning polymer residues, wherein the tungsten oxide passivating film that is insoluble to basic solutions prevents the at least one of the plurality of tungsten plugs from eroding in the basic cleaning solution.

2. A method for making reliable interconnect structures as recited in claim 1, further comprising:

fixing the dilute acid solution to have a pH level of between about 1.5 and 3.

3. A method for making reliable interconnect structures as recited in claim 1, further comprising:

maintaining the semiconductor substrate in the dilute acid solution for between about 2 minutes and about 20 minutes.

4. A method for making reliable interconnect structures as recited in claim 1, further comprising:

rinsing the semiconductor substrate after the submersing into the dilute acid solution and before the submersing into the basic solution.

5. A method for making reliable interconnect structures as recited in claim 1, wherein the basic solution has a pH level that is about 7 or greater.

6. A method for making reliable interconnect structures as recited in claim 2, wherein the dilute acid solution is a dilute nitric acid ($HNO_3$).

7. A method for fabricating an interconnect structure on a semiconductor substrate that has a first dielectric layer, a first patterned metallization layer, a second dielectric layer over the first patterned metallization layer, and a plurality of tungsten plugs formed in the second dielectric layer, the method comprising:

patterning a second metallization layer that overlies the second dielectric layer and the plurality of tungsten plugs, such that the patterning leaves at least one of the plurality of tungsten plugs not completely covered by the second metallization layer;

submersing the semiconductor substrate into a dilute nitric acid solution until a passivating tungsten oxide is formed over a portion of the at least one of the plurality of tungsten plugs that is not completely covered by the second metallization layer; and submersing the semiconductor substrate into a basic cleaning solution after the submersing into the dilute nitric acid solution, wherein the passivating tungsten oxide prevents the at least one of the plurality of tungsten plugs from eroding in the basic cleaning solution.

8. A method for fabricating an interconnect structure as recited in claim 9, further comprising:

rinsing the semiconductor substrate after the submersing into the dilute nitric acid solution and before the submersing into the basic cleaning solution.

9. A method for fabricating an interconnect structure as recited in claim 7, wherein the passivating tungsten oxide is insoluble.

10. A method for fabricating an interconnect structure as recited in claim 7, wherein the dilute nitric acid is about 100 parts water and about 1 part nitric acid ($HNO_3$).

11. A method for fabricating an interconnect structure as recited in claim 7, further comprising:

fixing the dilute nitric acid solution to have a pH level of between about 1.7 and 2.7.

12. A method for fabricating an interconnect structure as recited in claim 11, wherein the passivating tungsten oxide is insoluable.

13. A method for fabricating an interconnect structure as recited in claim 8, further comprising:

fixing the dilute nitric acid solution to have a pH level of between about 1.5 and 3.

14. A method for fabricating an interconnect structure as recited in claim 13, further comprising:

maintaining the semiconductor substrate in the dilute nitric acid solution for between about 2 minutes and about 20 minutes.

15. A method for fabricating an interconnect structure as recited in claim 14, wherein the basic cleaning solution has a pH that is 7 or greater.

\* \* \* \* \*